United States Patent [19]

Imai et al.

[11] Patent Number: 5,373,171
[45] Date of Patent: * Dec. 13, 1994

[54] THIN FILM SINGLE CRYSTAL SUBSTRATE

[75] Inventors: Takahiro Imai; Naoji Fujimori; Hideaki Nakahata, all of Itami, Japan

[73] Assignee: Sumitomo Electric Industries, Ltd., Japan

[*] Notice: The portion of the term of this patent subsequent to Jul. 13, 2007 has been disclaimed.

[21] Appl. No.: 165,734

[22] Filed: Mar. 9, 1988

[30] Foreign Application Priority Data

Mar. 12, 1987 [JP] Japan .................................. 62-58383
Aug. 10, 1987 [JP] Japan .................................. 62-200460

[51] Int. Cl.$^5$ ............................................. H01L 27/10
[52] U.S. Cl. ............................................. 257/77; 257/78; 257/258; 437/84; 437/100
[58] Field of Search ............... 357/61, 4, 16; 437/84, 437/100

[56] References Cited

U.S. PATENT DOCUMENTS

| | | | |
|---|---|---|---|
| 4,028,149 | 6/1977 | Deines | 357/61 |
| 4,254,429 | 3/1981 | Yamazaki | 357/61 |
| 4,661,176 | 4/1987 | Manasevit | 357/4 |
| 4,751,554 | 6/1988 | Schnable | 357/4 |
| 4,762,806 | 8/1988 | Suzaki | 437/100 |

*Primary Examiner*—Andrew J. James
*Attorney, Agent, or Firm*—Cushman, Darby & Cushman

[57] ABSTRACT

A thin film single crystal substrate useful in the production of a semiconductor, comprising a base substrate made of single crystal diamond and at least one thin film of a single crystal of a material selected from the group consisting of silicon carbide, silicon, boron nitride, gallium nitride, indium nitride, aluminum nitride, boron phosphide, cadmium selenide, germanium, gallium arsenide, gallium phosphide, indium phosphide, gallium antimonide, indium arsenide, indium antimonide, aluminum phosphide, aluminum arsenide, aluminum antimonide, cadmium telluride, mercury sulfide, zinc oxide, zinc sulfide, zinc selenide and zinc telluride, and optionally an intermediate layer between the base substrate and the thin film of single crystal, which optionally comprises an intermediate layer between the base substrate and the thin film of single crystal.

7 Claims, 3 Drawing Sheets

(000)

THIN FILM SINGLE CRYSTAL SUBSTRATE

BACKGROUND OF THE INVENTION

1. Field of the Invention

The present invention relates to a thin film single crystal substrate which is useful in the production of a semiconductor. More particularly, it relates to a thin film single crystal substrate comprising a single crystal diamond base and at least one film of a single crystal material formed thereon.

2. Description of the Prior Art

Some of materials having a crystalline structure is useful as materials of electric elements. For example, silicon carbide has been studied as a material for a heat and environment resistant element or a light-emitting element since it has several crystal structures and band gap of 2.2 to 3.3 eV depending on the crystal structure, its heat conductivity is as large as 4.9 W/cm.K, its maximum electron mobility is confirmed to be 1,000 $cm^2$/V.sec., and it is possible to control p-type and n-type valence electrons.

The crystal structures of silicon carbide are roughly classified into an α-type and a β-type. Since silicon carbide of the α-type hexagonal system (6H) has a large band gap of about 2.9 eV, it is believed that it can be used as a material for a blue light-emitting element. Silicon carbide of the β-type cubic system (3C) has a large electron mobility, it is investigated as a material for an environment resistant element.

Since a silicon carbide single crystal has a high melting point and is chemically stable, it is difficult to produce a large single crystal with good quality which can be used as a semiconductive material. Therefore, the single crystal of silicon carbide is formed by growing it on a silicon single crystal or sapphire in a gas or liquid phase (cf. Japanese Patent Kokai Publication Nos. 83588/1978 and 146299/1978).

However, the silicon single crystal has various drawbacks. For example, since it has a band gap of 1.1 eV which is smaller than that of the silicon carbide single crystal, it has smaller resistivity at high temperature. It has a low melting point and a small thermal conductivity of 1.5 W/cm.K). Because of these characteristics of silicon carbide, when the silicon carbide single crystal is grown on the silicon single crystal, the advantages of the latter as the heat resistant semiconductive material are greatly impaired. Therefore, the silicon carbide single crystal grown on the silicon single crystal is used by removing the latter with an acid, but the remaining thin film of the silicon carbide has a thickness of several ten μm and is easily cracked or strained, which deteriorates its handling properties.

When the silicon carbide single crystal is used without removing the silicon single crystal, elements should be separated by applying reverse bias at a p-n junction formed in the silicon carbide layer. This makes the production method complicated.

Although sapphire is an insulating material up to high temperature and thermally stable, it has some drawbacks such as a small coefficient of thermal conductivity of 0.11 W/cm.K and a large coefficient of thermal expansion of $7.8 \times 10^{-6}$/K.

In addition to the above proposals, it may be possible to grow a thin film single crystal of GaAs on the silicon single crystal or to grow the silicon single crystal on sapphire. However, these techniques have the same problems as above.

SUMMARY OF THE INVENTION

One object of the present invention is to provide a substrate having a large coefficient of thermal conductivity.

Another object of the present invention is to provide a substrate having a small coefficient of thermal expansion.

Further object of the present invention is to provide a substrate having good resistance against heat and/or environment.

These and other object of the present invention are achieved by a thin film single crystal substrate which comprises a base substrate made of single crystal diamond and at least one thin film of a single crystal of a material selected from the group consisting of silicon carbide, silicon, boron nitride, gallium nitride, indium nitride, aluminum nitride, boron phosphide, cadmium selenide, germanium, gallium arsenide, gallium phosphide, indium phosphide, gallium antimonide, indium arsenide, indium antimonide, aluminum phosphide, aluminum arsenide, aluminum antimonide, cadmium telluride, mercury sulfide, zinc oxide, zinc sulfide, zinc selenide and zinc telluride, and optionally an intermediate layer between the base substrate and the thin film of single crystal.

DETAILED DESCRIPTION OF THE INVENTION

Figure 1:
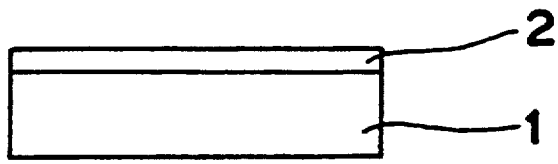
FIGS. 1 and 2 are cross sections of typical structures of the thin film single crystal substrate according to the present invention.

The diamond single crystal has a larger coefficient of thermal conductivity and a smaller relative dielectric constant than other materials as shown in Table 1. When the diamond is used as a base material for a semiconductive substrate, it is possible to produce an element which resists a large amount of heat such as a high power high speed element. Since the diamond has a wide band gap, a highly pure single crystal of diamond is a good insulator up to about 1,000° C. and thermally and chemically stable up to about 1,000° C., it is possible to make use of its advantages when it is used in the heat and environment resistant element in combination with silicon carbide.

TABLE 1

|  | Band gap (eV) | Coefficient of thermal conductivity (W/cm · K.) | Relative dielectric constant |
| --- | --- | --- | --- |
| Diamond | 5.5 | 20 | 5.7 |
| Silicon carbide | 2.2–3.3 | 4.9 | 10 |
| Silicon | 1.1 | 1.5 | 12 |

TABLE 1-continued

|  | Band gap (eV) | Coefficient of thermal conductivity (W/cm · K.) | Relative dielectric constant |
|---|---|---|---|
| Sapphire | — | 0.11 | 10.5 |

According to the present invention, the base substrate may be made of natural or artificial diamond. Nowadays, an artificial single crystal diamond of several millimeter square having less impurities (particularly, nitrogen) is produced by the extra-high pressure method.

According to the extra-high pressure method, it is possible to produce a p-type semiconductive single crystal diamond, namely the IIb type, which is suitable for the production of a high power element. When the high power element is produced, an electrode is provided on the single crystal diamond.

By a thin film method or an ion-implantation method, either of p-type and n-type diamond can be produced. Preferably, the single crystal diamond is a p-type semiconductive diamond which contains at least one of boron and aluminum as an impurity.

The plane of the single crystal diamond of the base on which the single crystal thin film and/or the intermediate layer is grown may have any of orientations (100), (110), (111) and (211). Since the (111) plane orientation is difficult to abrase, the (100) and (110) orientations are preferred.

The thickness of the diamond base is usually from 0.05 mm to 5 mm, preferably from 0.1 mm to 0.5 mm.

The single crystal thin film formed on the single crystal diamond consists of at least one single crystal of a material selected from the group consisting of silicon carbide, silicon, boron nitride, gallium nitride, indium nitride, aluminum nitride, boron phosphide, cadmium selenide, germanium, gallium arsenide, gallium phosphide, indium phosphide, gallium antimonide, indium arsenide, indium antimonide, aluminum phosphide, aluminum arsenide, aluminum antimonide, cadmium telluride, mercury sulfide, zinc oxide, zinc sulfide, zinc selenide and zinc telluride. The single crystal may be a mixed crystal. Further, two or more thin films of the single crystal may be formed.

The thickness of the thin film single crystal is usually from 100 to 100,000 Å, preferably from 500 to 20,000 Å.

Since silicon carbide has similar bond status to that of diamond and a close lattice constant to that of diamond, the single crystal thin layer may be preferably made of cubic system or hexagonal system silicon carbide single crystal. Two or more of such thin layers can be laminated. In addition, the single crystal thin layer preferably made of p-type silicon carbide single crystal which contains at least one impurity element selected from the group consisting of boron, aluminum, gallium and indium or n-type silicon carbide single crystal which contains at least one impurity element selected from the group consisting of nitrogen, phosphorus, arsenic, antimony and lithium. Two or more of the p-type single crystal thin films and/or the n-type single crystal thin films may be laminated.

The thin film single crystal may be formed on the diamond base by any of conventional methods such as gas phase methods (e.g. the sublimation method, the thermal CVD method, the plasma CVD method, the reaction deposition method and the MBE method) and liquid phase methods.

When the lattice constant of the single crystal to be grown is very different from that of the single crystal diamond, the thin film single crystal substrate of the present invention may comprise an intermediate layer between the diamond base and the thin film of single crystal. For example, the single crystal diamond has a lattice constant of 3.5667 Å, while the silicon single crystal has a lattice constant of 5.4301 Å. In such case, flexibility of the conditions in growing the single crystal on the diamond single crystal is very limited, and it is difficult to grow a single crystal having good quality. The intermediate layer may be made of single crystal silicon carbide or single crystal diamond.

The single crystal silicon carbide can be formed by the CVD (chemical vapor phase deposition) method, the modified CVD (MCVD) method, the MBE (molecular beam epitaxy) method. The single crystal diamond can be formed by the thermal CVD method, the plasma CVD method, the electron beam CVD method, the ion sputtering method, the optical CVD method and the like.

Figure 2:
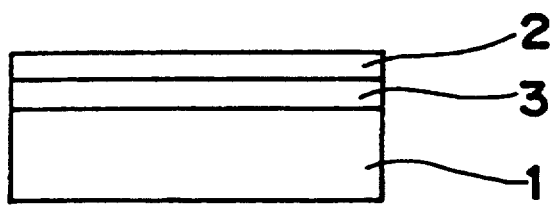

As described above, the thin film single crystal substrate consists of the single crystal diamond base 1 and the single crystal thin layer 2 as shown in FIG. 1 or consists of the single crystal diamond base 1, the intermediate layer 3 and the single crystal thin film 2 as shown in FIG. 2.

PREFERRED EMBODIMENT OF THE INVENTION

The present invention will be illustrated in the following examples.

EXAMPLE 1

On the (100) plane of a base made of IIa type single crystal diamond (2×2×0.3 mm) produced by the extra-high pressure method, a thin film of silicon having a thickness of 5,000 Å was formed by plasma CVD from a mixture of monosilane ($SiH_4$) and hydrogen (molar ratio of 1:50) at 1,050° C. under reduced pressure of 5 Torr.

Figure 3:
FIG. 3 is a photograph of reflection electron beam diffraction pattern of the thin film single crystal formed in Example 1.

After heating the produced substrate at 900° C. under reduced pressure of $1 \times 10^{-8}$ Torr, the substrate was observed by reflection electron beam diffraction to give a photograph of FIG. 3. The diffraction pattern had the Kikuchi Line, which indicated that the silicon thin film consisted of single crystal with good quality.

EXAMPLE 2

On the same plane of the same single crystal diamond as used in Example 1, as an intermediate layer, a silicon carbide thin film having a thickness of 500 μm was formed by CVD from a mixture of monosilane, propane and hydrogen (a molar ratio of 1:4:95) at 1,350° C. under reduced pressure of 400 Torr for 20 minutes. On the silicon carbide intermediate layer, an n-type phosphorus-doped silicon film was grown by CVD from a mixture of monosilane, $PH_3$ and hydrogen (a molar ratio of $10^5:1:10^7$) at 1,050° C. under reduced pressure of 100 Torr. for 30 minutes. The reflection electron beam diffraction pattern of the formed silicon film had the Kikuchi Line, which indicated that the silicon thin film consisted of single crystal. According to the measurement of the Hall effect, the n-type silicon film had a carrier density of $3 \times 10^{17}/cm^3$ and electron mobility of 900 $cm^2/V.sec$.

EXAMPLE 3

A piece of Ia type natural single crystal diamond (2×2×0.3 mm) with the (111) plane exposed was placed in a quartz reactor. After evacuating the reactor, monosilane, propane and hydrogen were supplied to the reactor at a flow ratio of 1:4:95 with keeping a temperature of the diamond single crystal at 1,300° C. by an infrared heater for 30 minutes. A thin film of silicon carbide single crystal was formed on the (111) plane of the single crystal diamond.

The silicon carbide crystal on the diamond was observed by reflective electron beam diffraction. Clear spots were observed, which confirmed the formation of single crystal thin film. The lattice constant $a_0$ of silicon carbide single crystal was calculated to be 4.38 Å, which substantially coincides with that of the cubic system (3C) silicon carbide (4.36 Å).

EXAMPLE 4

On the (110) plane of a base made of Ib type artificial single crystal diamond (2×3×0.5 mm) produced by the extra-high pressure method, a thin film of p-type semiconductive single crystal diamond having a thickness of 2.0 μm was formed by the conventional microwave plasma CVD method with microwave power of 300 W under reduced pressure of 55 Torr with flowing methane, diboran and hydrogen at a flow ratio of $10^3:1:10^5$ in the quartz reactor.

On the p-type semiconductive single crystal diamond, a silicon carbide single crystal film was formed by the same microwave plasma CVD method as above but using the microwave power of 500 W and reduced pressure of 200 Torr. with flowing monosilane, methane, hydrogen and argon at a flow ratio of 1:3:46:50 for one hour during which the substrate temperature was kept at 1,250° C.

Figure 4:
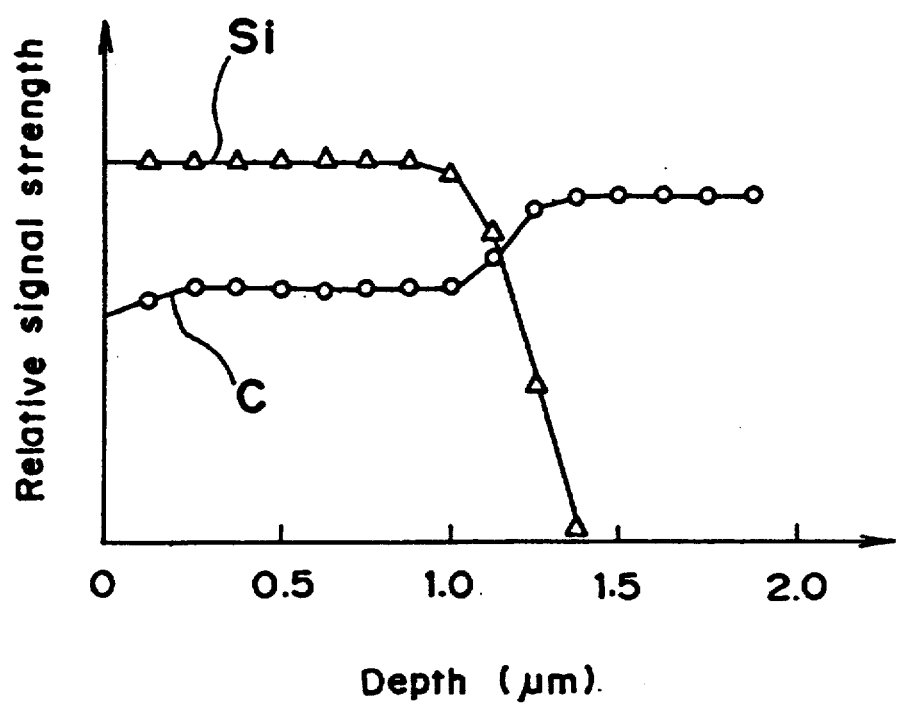
FIG. 4 shows the results of the Auger spectrum of the silicon carbide single crystal formed in Example 4.

The result of elemental analysis of the silicon carbide single crystal film in the depth direction by Auger spectrum is shown in FIG. 4. To the depth of 1.3 μm, silicon and carbon atoms were detected, which means that the thickness of the silicon carbide film was 1.3 μm.

The reflective electron beam diffraction pattern of the silicon carbide single crystal film had spots and the Kikuchi Line, which indicated that the crystal was the cubic system (3C) silicon carbide single crystal.

EXAMPLE 5

Figure 5:
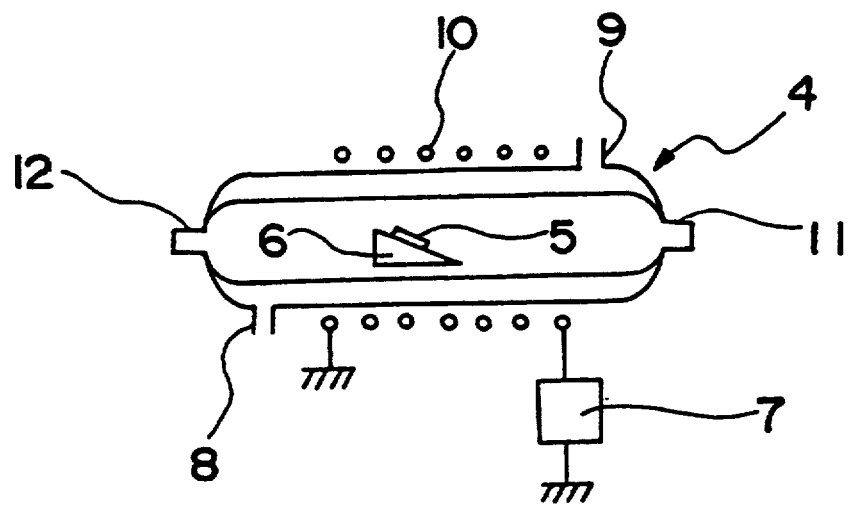
FIG. 5 is a schematic cross section of an apparatus for forming a thin film single crystal used in Example 5.

A thin film single crystal was formed by using an apparatus shown in FIG. 5, which comprises a double-walled quartz tube 4, a supporting plate 6 made of graphite covered with silicon carbide, a 400 KHz high-frequency oscillator 7, an inlet 8 and an outlet 9 for cooling water, a (water cooled) work coil 10, and an inlet 11 and an outlet 2 for gasses.

A piece 5 of single crystal of IIb type natural diamond (2×2×0.5 mm) was placed on the supporting plate 6. After evacuating the interior of the quartz tube 4, an AC current of 400 KHz and 2 KW was applied to the work coil 10 with supplying hydrogen gas in the tube to keep the pressure at 80 Torr. While keeping the supporting plate 6 at 1,340° C. by induction heating from the coil 10, nitrogen, monosilane, propane and hydrogen were supplied at a flow ratio of 1:50:100:2,000 into the tube for 20 minutes under reduced pressure of 80 Torr to grow n-type silicon carbide single crystal.

Then, diboran, monosilane, propane and hydrogen were supplied at the flow ratio of 0.2:50:100:2,000 for 30 minutes under the same conditions to grow p-type silicon carbide single crystal.

Figure 6:
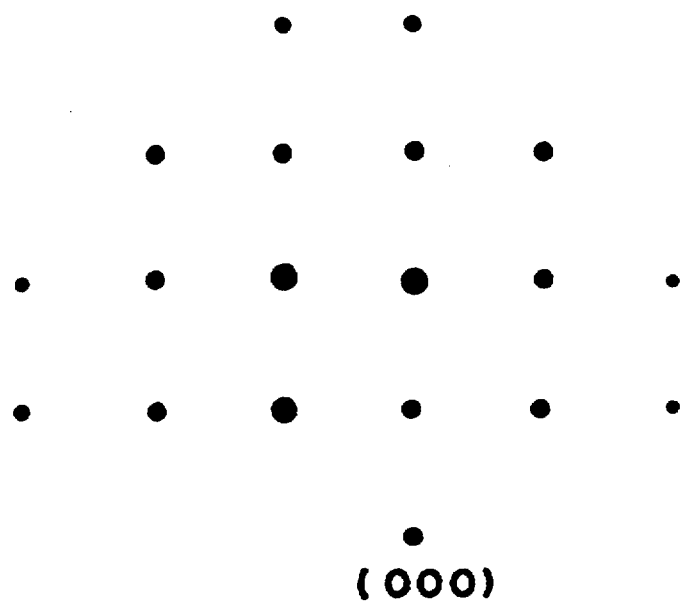
FIG. 6 is a reflection electron beam diffraction pattern of the thin film silicon carbide single crystal formed in Example 5.

The reflective electron beam diffraction analysis of the surface of grown silicon carbide layer gave a diffraction image as shown in FIG. 6. From this pattern, the lattice constant calculated to be 4.35 Å, which indicated that the crystal was the cubic system (3C) silicon carbide.

EXAMPLE 6

A piece of Ib type single crystal artificial diamond was placed in a graphite crucible together with hexagonal system silicon carbide powder and heated to 1,750° C. under reduced pressure of 0.5 Torr while supplying argon gas to grow silicon carbide crystal on the surface of the diamond piece for 15 minutes by sublimation of silicon carbide.

The reflection electron beam diffraction analysis of the surface of grown silicon carbide layer revealed that the crystal was the hexagonal system (6H) silicon carbide.

What is claimed is:

1. A thin film single crystal substrate comprising:
   a base substrate made of a single crystal diamond; and
   at least one thin film on said base substrate, said thin film being of a single crystal of a material selected from the group consisting of a silicon carbide, silicon, boron nitride, gallium nitride, indium nitride, aluminum nitride, boron phosphide, cadmium selenide, germanium, gallium arsenide, gallium phosphide, indium phosphide, gallium antimonide, indium arsenide, indium antimonide, aluminum phosphide, aluminum arsenide, aluminum antimonide, cadmium telluride, mercury sulfide, zinc oxide, zinc sulfide, zinc selenide and zinc telluride.

2. The thin film single crystal substrate according to claim 1, further comprising a diamond single crystal intermediate layer between the base substrate and the thin film of single crystal.

3. The thin film single crystal substrate according to claim 1, wherein the diamond single crystal base is made of a p-type diamond containing at least one impurity element selected from the group consisting of boron and aluminum.

4. The thin film single crystal substrate according to claim 1, wherein the thin film single crystal comprises a thin film of cubic system silicon carbide single crystal.

5. The thin film single crystal substrate according to claim 1, wherein the thin film single crystal comprises a thin film of hexagonal system silicon carbide single crystal.

6. The thin film single crystal substrate according to claim 1, wherein the thin film single crystal comprises a thin film of a p-type silicon carbide single crystal containing at least one impurity element selected from the group consisting of boron, aluminum, gallium and indium.

7. The thin film single crystal substrate according to claim 1, wherein the thin film single crystal comprises a thin film of an n-type silicon carbide single crystal containing at least one impurity element selected from the group consisting of nitrogen, phosphorus, arsenic, antimony and lithium.

* * * * *